United States Patent [19]

Kashida et al.

[11] Patent Number: 5,068,855
[45] Date of Patent: Nov. 26, 1991

[54] ERROR CORRECTING METHOD AND APPARATUS

[75] Inventors: Motokazu Kashida, Musashino; Akihiro Shikakura, Atsugi; Shinichi Yamashita; Tetsuya Shimizu, both of Yokohama, all of Japan

[73] Assignee: Canon Kabushiki Kaisha, Tokyo, Japan

[21] Appl. No.: 379,878

[22] Filed: Jul. 14, 1989

[30] Foreign Application Priority Data

Jul. 18, 1988 [JP] Japan ............................. 63-180023
Jul. 29, 1988 [JP] Japan ............................. 63-189803

[51] Int. Cl.$^5$ ............................................. G06F 11/10
[52] U.S. Cl. ............................................. 371/37.4
[58] Field of Search ............... 371/37.4, 37.1, 50.1, 371/38.1, 39.1, 40.1, 37.6

[56] References Cited

U.S. PATENT DOCUMENTS

| 4,107,650 | 8/1978 | Luke | 371/39.1 |
| 4,414,666 | 11/1983 | Nelson | 371/37.1 |
| 4,719,628 | 1/1988 | Ozaki | 371/37.4 |
| 4,763,330 | 8/1988 | Shimizu | 371/37.1 X |
| 4,849,975 | 7/1989 | Patel | 371/38.1 |
| 4,868,827 | 9/1989 | Yamada | 371/39.1 X |
| 4,881,232 | 11/1989 | Sako | 371/37.4 |
| 4,928,280 | 5/1990 | Nielson | 371/39.1 |

Primary Examiner—Robert W. Beausoliel
Attorney, Agent, or Firm—Fitzpatrick, Cella, Haper & Scinto

[57] ABSTRACT

A decoding method for digital data having a two-dimensional arrangement including error correction check codes in both for first and second directions, wherein, an error correcting method having a value in which the result of the arithmetic operation for error correction was added to syndromes in at least one of the first and second directions is obtained and error correction is again executed on the basis of this value. In addition, an error correcting apparatus having a plurality of syndrome calculating units are provided so that a plurality of syndromes can be simultaneously calculated.

14 Claims, 3 Drawing Sheets

ERROR CORRECTING METHOD AND APPARATUS

BACKGROUND OF THE INVENTION

1. Field of the Invention

The present invention relates to an error correcting apparatus and, more particularly, to method and apparatus for correcting errors in data to which an error correction code was added.

2. Related Background Art

Hitherto, a product code has been known as a form of an error correction code having a two-dimensional arrangement. FIG. 3 is an arrangement diagram of a product code. In the diagram, the portion of $k_1 \times k_2$ corresponds to the original digital information having a two-dimensional arrangement. A predetermined check code $m_1$ is added to every row in a $k_1$ direction shown by an arrow A and a code $c_l$ is constructed. On the other hand, a predetermined check code $m_2$ is added to every column in a $k_2$ direction shown by an arrow B and a code $c_2$ is constructed. The code $c_1$ is the $(n_1, k_1)$ code and the code $c_2$ is the $(n_2, k_2)$ code.

A sole decoding method in the lateral or vertical direction will be first described as a decoding method of such a code. The error correction decoding method generally includes the following four steps.

step (1) Syndrome calculation
step (2) Calculation of the error position polynomial and error evaluation polynomial
step (3) Estimation of the error position and error value (size) in accordance with the results of the calculation in step 2
step (4) Execution of the error correction of the estimated position and size In step (1), since syndromes are obtained as values of the polynomial of the $(n-1)$ order in which all of the symbols of the number corresponding to a code length n of the code are used as coefficients, the arithmetic operation to sequentially input all of the symbols is executed. Therefore, n/S clocks are necessary when the calculation is executed S times in parallel for at least one syndrome. On the other hand, in many cases, S is generally set to 1 to reduce the circuit scale. In this case, the period of time corresponding to n clocks is necessary. With respect to steps (2) to (4) as well, in many cases, the processes are generally executed within the period of time of n clocks.

On the other hand, in the case of the product code construction, a series of error corrections are once executed with respect to the code words of, for instance, $n_2 (=k_2+m_2)$ rows in the A direction and a series of error corrections are once performed with regard to the code words of $k_1$ columns in the B direction. Due to this, the error correcting capability can be raised as compared with the case of, for instance, the construction in only the A direction.

Further, there has been known a repetitive decoding method whereby the error corrections in both of the A and B directions as mentioned above are further repetitively executed to the codes of the product code construction. According to such a method, the error correcting capability can be further raised as compared with the case where the error corrections in the A and B directions are executed once at a time as mentioned above.

However, in the conventional repetitive method, the above steps (1) to (4) are repeated with respect to each of the code words (there are $n_2$ code words having the arrangement in the A direction and there are $n_1$ code words having the arrangement in the B direction).

Therefore, assuming that the processes are repetitively executed t times for the period of time of n clocks in step (1) and for the period of time of n clocks in steps (2) to (4), the following processing time is needed.

$$\{(n_1+n_1)n_2+(n_2+n_2)k_1\} \times t = 2t(n_1 n_2 + n_2 k_1) \quad (1)$$

As mentioned above, an extremely long processing time is necessary in the case of executing the repetitive method as mentioned above in order to raise the error correcting capability in the conventional manner.

On the other hand, in any of the A and B directions shown in FIG. 3, in the case of calculating the syndromes, in addition to the problem in the above repetitive method, there is also a problem such that the data shown in FIG. 3 needs to be read out a plurality of times and it is difficult to realize the high speed error correcting operation.

The above problems will now be described with reference to FIGS. 4 and 5.

FIG. 4 is a diagram showing an example of a conventional error detection correction decoding unit.

In FIG. 4, an explanation will be made with respect to the example of the $(n-k-2)$ correction decoding of the data which was double encoded by the code lengths $(n_1, k_1)$ and $(n_2, k_2)$ in the $C_1$ (lateral) and $C_2$ (vertical) directions as shown in FIG. 5. The data block including the error correction code (ECC) shown in FIG. 5 is hereinafter referred to as an ECC block.

In the construction shown in FIG. 5, the data to which errors were mixed by the transmission path is first written into a data memory 301 comprising a RAM on a unit basis of $n_1 \times n_2$ blocks After that, the data is sequentially read out in the $C_1$ direction by the address operation of the memory 301 and syndromes are calculated by a syndrome calculating unit 302. The error position and size are calculated by an error detection correction processing unit 303 on the basis of the syndromes calculated, thereby correcting the erroneous data in the data memory 301. After such processes were executed with respect to $n_1$ lines, the similar processes are also executed in the $C_2$ direction with regard to $n_2$ lines. After completion of a series of processes, the error corrected data is read out of the data memory 301 on an ECC block unit basis.

In the conventional example, in order to detect and correct the errors in the ECC block shown in FIG. 4, the following number of access times of the data memory 301 is needed. That is, $(n_1 \times n_2)$ times are necessary to write the input data. $(n_1 \times n_2)$ times are necessary to read out to calculate the syndromes in the $C_1$ direction and $(n_1-k_1-2)$ times are necessary per maximum lines to write to correct the data. In the $C_2$ direction as well, $(n_1 \times n_2)$ times are similarly necessary to calculate the syndromes, $(n_2-k_2-2)$ times per maximum lines are necessary to correct the data, and $n_1 \times n_2)$ times are necessary to read out the output data. Thus, it is necessary to execute the accessing operations of total $4(n_1 \times n_2) + \alpha$ ($\alpha$ denotes the number of data to be corrected) times.

As mentioned above, according to the conventional construction, the number of access times of the memory is large. On the other hand, in realization of the high operating speed (cycle time) of the memory, since it is limited, the processing time of the error detection correction unit is long. In the case where the high operating speed is required, it is necessary to construct the circuits in parallel and to suppress the correcting capability or the like. Such a method causes the correcting capability to deteriorate and increases the circuit scale and a large problem occurs. Further, although the above conventional example has been described with respect to the case of processing the data to which the double encoded error correction code was added, in the case of executing the processes corresponding to the double encoding or more, the number of access times of the memory increases in proportion to them. Therefore, it is necessary to further increase the hardware scale of the processing unit.

SUMMARY OF THE INVENTION

In consideration of the above points, it is an object of the invention to provide a method of executing the error correction in a short time.

Another object of the invention is to provide an error correcting method or apparatus which can execute the error correction in a short time and at the high accuracy.

Under such objects, according to a preferred embodiment of the present invention, there is disclosed an error correcting method in a decoding method of digital data having a two-dimensional arrangement including error correction check codes in both of the first and second directions, wherein in at least one of the first and second directions, values in which the result of the arithmetic operation for error correction was added to syndromes are obtained, and the error correction is again executed on the basis of those value.

Still another object of the invention is to provide an error correcting apparatus having a construction suitable to execute the error correction at a high speed.

Still another object of the invention is to provide an error correcting apparatus which can realize the high processing speed of the error correction for the data to which the multiple encoded error correction code was added.

Under the above objects, according to a preferred embodiment of the invention, there is disclosed an error correcting apparatus comprising: a plurality of syndrome calculating units to which input data added with a multiple encoded error correction code is supplied; a syndrome memory to store syndromes oalculated by the plurality of syndrome calculating units: a data memory which is connected in parallel with the plurality of syndrome calculating units for the input data; and a correction processing unit to execute the error correction for data in the data memory by using the syndromes stored in the syndrome memory.

The above and other objects and features of the present invention will beccome apparent from the following detailed description and appended claims with reference to the accompanying drawings.

DETAILED DESCRIPTION OF THE PREFERRED EMBODIMENTS

In the first embodiment of the present invention which will be described hereinbelow, in the decoding of digital data having a two-dimensional arrangement having a digital data train of $n_1$ words including error correction detection check codes of $k_1$ words in the first direction and a digital data train of $n_2$ words including error correction detection check codes of $k_2$ words in the second direction, there is disclosed a data decoding method whereby in the case of repetitively executing the error correction in the first direction and the error correction in the second direction, there is provided memory means for storing the values in which the arithmetic operation corresponding to the error correcting operation which was executed in the first direction was applied to syndromes as a result of the error correction in the first direction and the values in which the arithmetic operation corresponding to the error correcting operation which was executed in the second direction was applied to the syndromes as a result of the error correction in the second direction. However, the invention is not obviously limited to such a construction.

An embodiment of the invention will be described hereinbelow.

It is assumed that all of the following arithmetic operations in the embodiment relate to the arithmetic operations on the Galois field. In the embodiment, the code words of $c_1$ or $c_2$ are based on the Reed Solomon code and a check. matrix H is as follows.

$$H = \begin{bmatrix} 1 & \ldots & 1 & 1 & 1 \\ \alpha^{n-1} & \ldots & \alpha^2 & \alpha & 1 \\ \alpha^{2(n-1)} & \ldots & \alpha^4 & \alpha^2 & 1 \\ \alpha^{3(n-1)} & \ldots & \alpha^6 & \alpha^3 & 1 \\ \cdot & & \cdot & & \\ \cdot & & \cdot & & \\ \cdot & & \cdot & & \\ \alpha^{(d-1)(n-1)} & \ldots & \alpha^{(d-1)2} & \alpha^{d-1} & 1 \end{bmatrix}$$

where d is a hamming distance.

$$C = (c_{n-1}, c_{n-2}, \ldots c_1, c_0)$$

it is the reception code words such that $$\overline{C} = (c_{n-1} + e_{n-1}, \ldots, c_1 + e_1, C_0 + e_0)$$

to which error patterns E $$E = (e_{n-1}, e_{n-2}, \ldots e_1, e_0)$$

were added on the transmission path are decoded. When all of the error patterns are 0, $\overline{C} = C$ and all of the syndromes are set to 0. Such syndromes $S_j$ (j=0 to d−1) are expressed by $$S_j = \sum_{i=0}^{n-1} e_i \alpha^{ij}$$

Since there are $n_2$ code words in the A direction, assuming that a hamming distance is set to $d_1$, the number of syndromes corresponding to those $n_2$ code words is $$n_2 \times (d_1 - 1)$$

On the other hand, assuming that a hamming distance is set to $d_2$, $k_1 \times (d_2 - 1)$ syndromes exist in the B direction.

Figure 1:
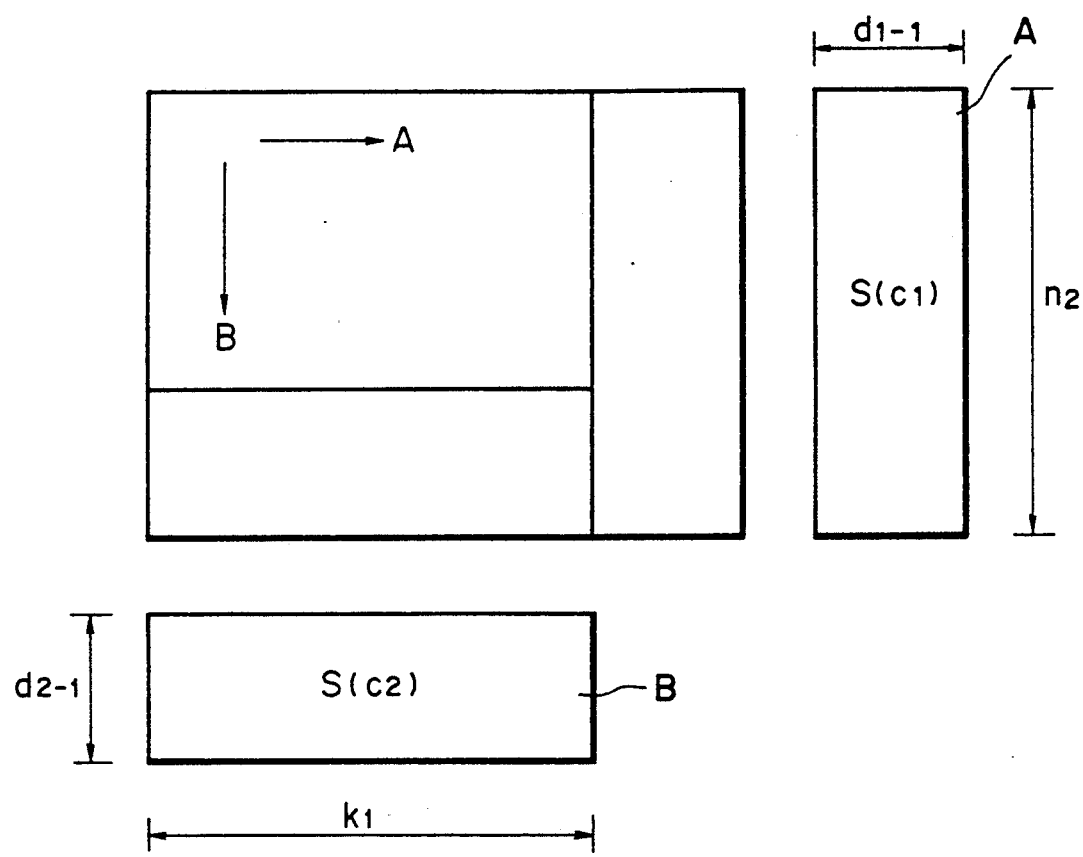
FIG. 1 is a diagram showing a memory construction in an embodiment of the present invention.

All of the syndromes are stored into memories A and B shown by $S(c_1)$ and $S(c_2)$ in FIG. 1. In the embodiment, in each error correcting process, after the error correction in step (4) was executed, $$e_x \alpha^{xj}$$

in consideration of the syndrome number j is added to the error pattern $e_x$ and error position $\alpha^x$ which were estimated for the relevant syndrome.

That is, assuming that the new syndrome is set to $S_j'$.

$$S_j' = S_j + e_x \alpha^{xj}$$

The new syndrome $S_j'$ is written into the memory A or B and is used as a basic syndrome in the next, that is, the second and subsequent repetitive error correcting operations.

Due to this, in the second (t=2) and subsequent repetitive error correcting operations, there is no need to execute the arithmetic operation of each syndrome. The content of the memory $S(c_1)$ or $S(c_2)$ coincides with the value of the syndrome at each time point.

Therefore, the time which is necessary for the processes of repetitive t times is calculated in a manner similar to the above and becomes as follows.

$$\{(n_1 + n_1)n_2 + (n_2 n_2)k_1\} + \{n_1 n_2 + n_2 k_1\}(t-1) = (t+1)(n_1 n_2 + n_2 k_1) \quad (2)$$

Thus, it will be understood that the processing time is reduced by only the time of $$(t-1)(n_1 n_2 + n_2 k_1)$$

as compared with the processing time shown in the equation (1) in the conventional example.

Although the above embodiment has been described with respect to the calculation of the processing time, for instance, in the case of executing the processes in steps 1 and steps 2 to 4 by the pipeline processes or the like, the processing time is merely slightly reduced; however, the circuits for such pipeline processes can be remarkably decreased. On the other hand, in the case of executing only steps 2 to 4 by the pipeline processes, assuming that the circuit scale is the same, the processing time can be obviously reduced into about half the time.

As described above, according to the method of the embodiment, a data decoding method which can extremely reduce the processing time can be provided.

A construction of an error correcting apparatus in another embodiment of the invention will now be described.

Figure 2:
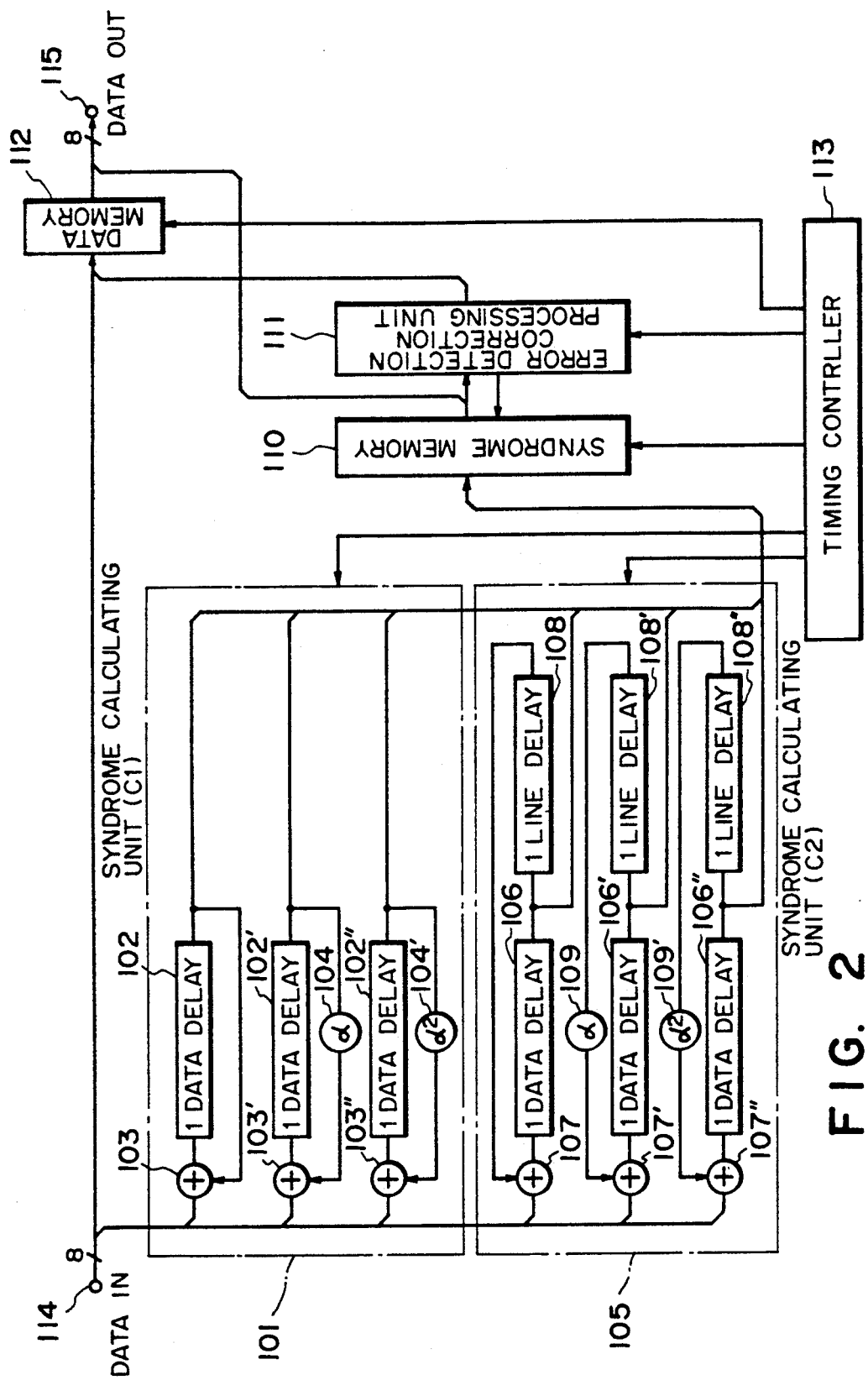
FIG. 2 is a block diagram showing a construction of an error correcting apparatus as an embodiment of the invention.
Figure 3:
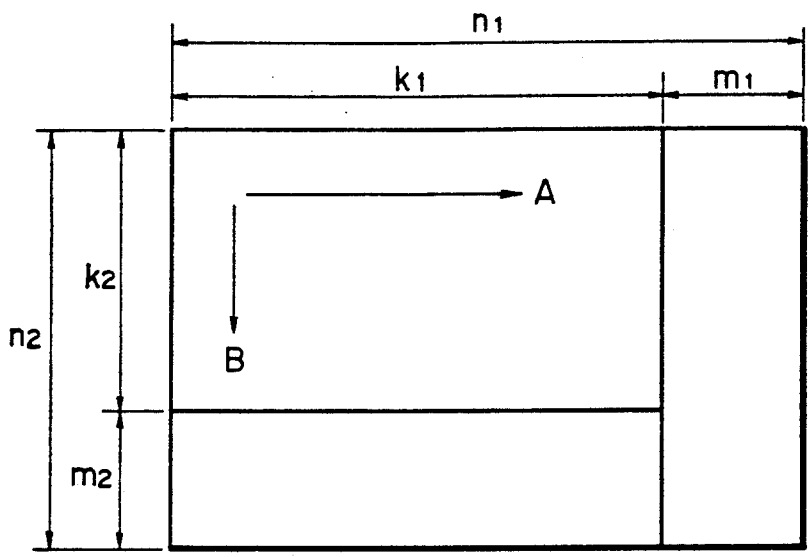
FIG. 3 is a diagram showing a construction of a product code.
Figure 4:
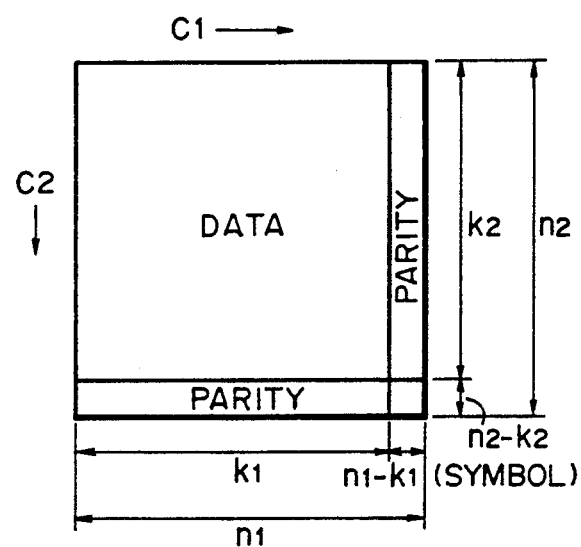
FIG. 4 is a diagram showing a data block to which an error correction code was added.
Figure 5:
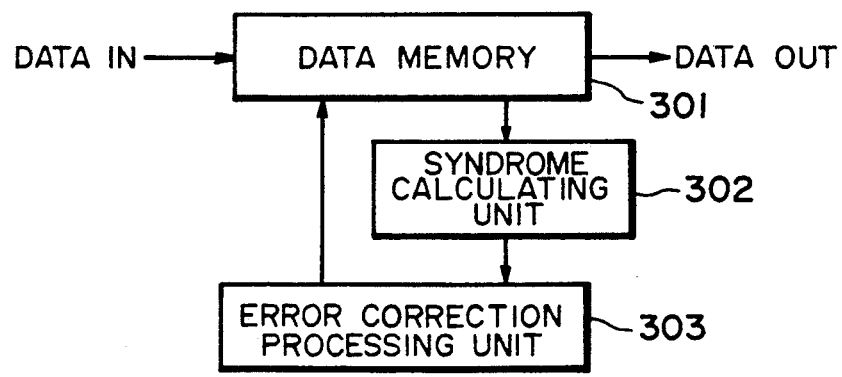
FIG. 5 is a block diagram showing an example of a construction of a conventional error correcting apparatus.

FIG. 2 is a diagram showing a construction of an error correcting apparatus for executing one correction decoding of the double encoded Reed Solomon code as shown in FIG. 4. Data to which the double encoded Reed Solomon code was added is supplied to an input terminal 114 through a transmission path. The input data is written into a data memory 112 on a data block unit basis of eight bits. The data memory 112 has a capacity which can store the data in which the error correction codes were eliminated from data to be arithmetically operated in a syndrome calculating unit, which will be explained hereinlater. Simultaneously with the writing of the input data into the data memory 112, syndromes of $C_1$ and $C_2$ are simultaneously calculated in syndrome calculating units 101 and 105. The syndrome calculating unit 101 on the $C_1$ side comprises: adders 103, 103', and 103''; one-data delays 102, 102', and 102''; and multipliers 104 and 104'. Assuming that reception data is set to $\hat{W}_i$ and the root of the generating polynomial is set to $\alpha^m$, syndromes $S_0$, $S_1$, and $S_2$ can be calculated by the following equations (1) to (3).

$$S_0 = \sum_{i=1}^{n} \hat{W}_i \quad (1)$$

$$S_1 = \sum_{i=1}^{n} \hat{W}_i \alpha^{n-1} \quad (2)$$

$$S_2 = \sum_{i=1}^{n} \hat{W}_i (\alpha^2)^{n-1} \quad (3)$$

On the other hand, in the syndrome calculating unit 105 on the $C_2$ side, one-line delays 108, 108', and 108'' to execute the arithmetic operations in the vertical direction are added to one-data delays 106, 106', and 106''. The calculating unit 105 calculates syndromes by the arithmetic operations of the above equations (1) to (3) in a manner similar to the case of $C_1$. Reference numerals 107, 107', and 107'' denote adders and 109 and 109' indicate multipliers.

The calculated syndromes are sequentially written into a syndrome memory 110. The syndromes are rewritten by the syndrome memory 110 as will be explained hereinlater, so that the parallel processes can be accomplished. The error correcting operation will now be described hereinbelow. At a time point when the error correcting operation is executed, the writing of the input data into the data memory 112 and the writing of the syndromes of $C_1$ and $C_2$ into the syndrome memory 110 have already been completed. The correcting operation is executed by a series of processes such that an error detection correction processing unit 111 reads out the syndromes from the syndrome memory 110 and calculates the error position and size and rewrites the erroneous data in the input data in the data memory 112 on the basis of the result of the error position and size calculated. Such processes are sequentially executed with respect to $C_1$ and $C_2$. However, since the data in the data memory 112 is rewritten by the correcting operation on the $C_1$ side which is first executed, the values of the syndromes on the $C_2$ side of the rewritten data differ. Therefore, in a manner similar to FIG. 1 described, upon completion of the correcting operation on the C side, the product of the size of error of the data corrected by $C_1$ and the error position on the $C_2$ side of the data is added to the original syndromes on the $C_2$ side of the data, thereby rewriting the syndromes in the syndrome memory 110. Due to this, even if the calculations of the syndromes of $C_1$ and $C_2$ are simultaneously executed, the accurate error correcting operation can be executed. At the time point when the correcting processes of $C_1$ and $C_2$ was finished, data is output from the data memory 112 through an output terminal 115. All of timing signals which are used in the apparatus in the embodiment are generated by a timing controller 113.

According to the above embodiment, since the hardware is constructed so as to calculate the $(n-k-2)$ syndromes simultaneously with the writing of the input data, the similar processes can be executed for the time which is about $1/(n-k-2)$ shorter than that in the conventional apparatus.

According to the construction of the above embodiment, syndromes of a plurality of codes can be simultaneously calculated by a plurality of syndrome calculating units and the data accessing operations to the data memory can also be simultaneously executed. This is because the syndromes are rewritten in the syndrome memory. That is, even if the calculations of the syndromes of the multiple codes are simultaneously executed, the error correcting processes can be correctly executed in the syndrome memory on the basis of the rewritten syndromes. Thus, the number of access times to the data memory remarkably decreases and the high error correction processing speed can be realized.

The above embodiment has been described with respect to the example of the double encoding. However, even in the case of handling the data which was subjected to the triple or more encoding, by similarly arranging a plurality of syndrome calculating units in parallel, the error correcting processes can be executed without increasing the number of access times of the memory.

As described above, according to the error correcting apparatus of the embodiment, it is possible to realize the high error correction processing speed for the data to which the multiple encoded error correction code was added without increasing the hardware scale.

What is claimed is:

1. A method of decoding digital data including error correction check codes in both of first and second directions when data is two-dimensionally arranged, comprising the steps of:

obtaining values in which the result of an arithmetic operation for error correction in at least one of said first and second directions is added to syndromes in the other direction; and detecting and correcting an error position within said digital data again on the basis of said values.

2. A method according to claim 1, wherein an erroneous digital data is $c_{n-1}+e_{n-1}, \ldots, C_1+e_1$, and $C_0+e_0$, $(C_{n-1}, \ldots, C_1,$ and $C_0$ are code words; and $e_{n-1}, \ldots, e_1$, and $e_0$ are error patterns on a transmission path); and wherein said syndromes $S_j$ are expressed by $$S_j = \sum_{i=0}^{n-1} e_i \alpha^{ij},$$

(i, j and n are integers and $\alpha$ is a constant).

3. A method according to claim 1, further comprising the step of:

repeating the step of obtaining the added value and the step of again detecting and correcting the error position in accordance with this sequence.

4. A method according to claim 1, wherein said result of the arithmetic operation is $e_x \cdot \alpha^{xj}$ in consideration of the syndrome number j to the estimated error pattern $e_x$ and error position $\alpha^x$ for said syndromes.

5. A method according to claim 1, wherein said digital data is Reed Solomon code.

6. An error correcting apparatus comprising:
(a) a plurality of syndrome calculating units to which input data added with a multiple encoded error correction code is supplied;
(b) a data memory which is connected in parallel with said plurality of syndrome calculating units for said input data;
(c) a syndrome memory to store syndromes calculated by said plurality of syndrome calculating units; and
(d) an error correction processing unit to execute error correction of the data in said data memory by using the syndromes stored in said syndrome memory.

7. An apparatus according to claim 6, wherein said syndrome calculating unit includes:
(a) a delay to delay the input data; and
(b) a multiplier to multiply the data delayed by said delay and a predetermined coefficient.

8. An apparatus according to claim 6, wherein said data memory has a capacity enough to store the data in which an error correction code is eliminated from the data which is calculated by said syndrome calculating unit.

9. An apparatus according to claim 6, wherien said syndrome memory is constructed as a memory for exclusive use.

10. An apparatus according to claim 6, wherein said error correction processing unit calculates error position and size by using said syndromes.

11. An error correcting apparatus comprising:
(a) a plurality of syndrome calculating units to which input data added with a multiple encoded error correction code is supplied;
(b) memory means for storing said input data, wherein the input data is written substantially simultaneously with the calculating by said plurality of syndrome calculating units; and
(c) a processing unit to calculate error position and size of said input data stored in said memory means by using a plurality of syndromes calculated by said plurality of syndrome calculating units.

12. An apparatus according to claim 11, wherein said processing unit corrects the input data stored in said memory means on the basis of the calculated error position and size.

13. An apparatus according to claim 11, wherein said plurality of syndrome calculating units are connected in parallel.

14. An apparatus according to claim 11, wherein the number of said syndrome calculating units corresponds to the number of syndromes to be calculated.

* * * * *

UNITED STATES PATENT AND TRADEMARK OFFICE
CERTIFICATE OF CORRECTION

PATENT NO. : 5,068,855

DATED : November 26, 1991

INVENTOR(S) : MOTOKAZU KASHIDA ET AL.

It is certified that error appears in the above-identified patent and that said Letters Patent is hereby corrected as shown below:

On title page,

AT [56] REFERENCES CITED

Attorney, Agent, or Firm, "Haper" should read --Harper--.

AT [57] ABSTRACT

Line 3, "for" should be deleted.

SHEET 2 OF 3

FIG. 2, "CONTRLLER" should read --CONTROLLER--.

COLUMN 2

Line 60, "$n_1 x n_2$)" should read --($n_1 x n_2$)--.

COLUMN 3

Line 35, "value." should read --values.--.
Line 49, "oalculated" should read --calculated--.
Line 57, "beccome" should read --become--.

COLUMN 4

Line 36, "check." should read --check--.
Line 49, "distance." should read --distance.
¶ Assuming the code words C are as follows--.
Line 55, "C=(cn-1+$e_{n-1}$,...,$c_1$+$e_1$, $C_0$+$e_0$)" should read
--$\hat{C}$=(cn-1+$e_{n-1}$,...,$c_1$+$e_1$, $C_0$+$e_0$)--.
Line 62, "C=C" should read --$\hat{C}$=C--.

UNITED STATES PATENT AND TRADEMARK OFFICE
CERTIFICATE OF CORRECTION

PATENT NO. : 5,068,855

DATED : November 26, 1991

INVENTOR(S) : MOTOKAZU KASHIDA ET AL.

It is certified that error appears in the above-identified patent and that said Letters Patent is hereby corrected as shown below:

COLUMN 5

Line 3, "cbrresponding" should read --corresponding--.
Line 35, "$\{(n_1+n_1)n_2+(n_2n_2)K_1\}$" should read
--$\{(n_1+n_1)n_2+(n_2+n_2)K_1\}$--.

COLUMN 6

Line 66, "was" should read --are--.

COLUMN 7

Line 51, "$c_{n-1}$" should read --$C_{n-1}$--.

COLUMN 8

Line 30, "enough" should read --large enough--.
Line 34, "wherien" should read --wherein--.

Signed and Sealed this

Fifth Day of October, 1993

Attest:

BRUCE LEHMAN

Attesting Officer    Commissioner of Patents and Trademarks